(12) United States Patent
Foote et al.

(10) Patent No.: US 6,248,635 B1
(45) Date of Patent: Jun. 19, 2001

(54) PROCESS FOR FABRICATING A BIT-LINE IN A MONOS DEVICE USING A DUAL LAYER HARD MASK

(75) Inventors: David K. Foote, San Jose; Hideki Komori; Bharath Rangarajan, both of Santa Clara; Steven K. Park, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/426,205

(22) Filed: Oct. 25, 1999

(51) Int. Cl.[7] .................................................. H01L 21/336
(52) U.S. Cl. .................. 438/287; 438/954; 438/216; 438/261; 438/262; 438/591
(58) Field of Search ..................... 438/954, 216, 438/261, 262, 287, 288, 424, 591, 976

(56) References Cited

U.S. PATENT DOCUMENTS

| | | | |
|---|---|---|---|
| 5,635,415 * | 6/1997 | Hong | 438/261 |
| 6,008,079 * | 12/1999 | Wu | 438/175 |
| 6,117,730 * | 9/2000 | Komori et al. | 438/258 |
| 6,169,006 * | 1/2001 | Gardner et al. | 438/303 |
| 6,187,651 * | 6/1997 | Oh | 438/435 |

* cited by examiner

*Primary Examiner*—Charles Bowers
*Assistant Examiner*—Jack Chen
(74) *Attorney, Agent, or Firm*—Brinks Hofer Gilson & Lione

(57) ABSTRACT

A process for fabricating a MONOS device having a buried bit-line includes providing a semiconductor substrate and forming an ONO structure to overlie the semiconductor substrate. Thereafter, a thin mask layer is formed to overlie the ONO structure to protect the ONO structure during a selective etch of a thick mask layer. The thick mask layer is formed to overlie the thin mask layer to protect the ONO structure during boron and arsenic implants. Thereafter, an etch process is performed in the ONO structure and a silicon oxide layer is formed to fill the etched area. A chemical-mechanical-polishing process is performed to planarize the silicon oxide layer and to form a planar surface continuous with an upper surface of the thick mask layer. The planarized silicon oxide layer functions as a bit-line oxide layer.

17 Claims, 2 Drawing Sheets

US 6,248,635 B1

PROCESS FOR FABRICATING A BIT-LINE IN A MONOS DEVICE USING A DUAL LAYER HARD MASK

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,427. "METHOD OF FABRICATING A MONOS FLASH CELL USING SHALLOW TRENCH ISOLATION".

U.S. patent application Ser. No. 09/427,402. "INTEGRATED METHOD BY USING HIGH TEMPERATURE OXIDE FOR TOP OXIDE AND PERIPHERY GATE OXIDE".

U.S. patent application Ser. No. 09/427,404. "PROCESS FOR FABRICATING A BIT-LINE USING BURIED DIFFUSION ISOLATION".

U.S. patent application Ser. No. 09/426,743. "PROCESS FOR FORMING A BIT-LINE IN A MONOS DEVICE".

FIELD OF THE INVENTION

The invention relates, generally, to the fabrication of semiconductor devices and, more particularly, to the fabrication of a buried bit-line structure in a non-volatile memory device.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other nonvolatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) cell. A problem exists with known MONOS cell fabrication techniques in that a thickness of a bit-line oxide layer is difficult to control which causes unpredictable MONOS cell performance. If the thickness of the bit-line oxide layer is not accurately formed, charge cannot be adequately stored within the ONO structure.

A problem occurs in that even a 5 to 10 angstrom variation in the thickness of the ONO structure's lower oxide layer can adversely affect the total amount of implanted arsenic. Thereafter, during the bit-line oxidation process, the amount of implanted arsenic affects the rate of oxidation of the bit-line oxide layer. In particular, a heavily doped arsenic implant enhances the oxidation rate. The variation of the arsenic concentration causes a twenty percent variation, or more, in the thickness of the bit-line oxidation layer. The variation in the bit-line oxidation layer produces unpredictable MONOS cell performance.

Another problem exists with known MONOS fabrication techniques in that the quality and cleanliness of the ONO structure cannot be guaranteed during the fabrication process of the transistor. One reason they cannot be guaranteed is that during production of the MONOS type cell, the ONO layer is subjected to repeated photoresist coatings and cleanings, for example, during boron and arsenic implants. To effectively remove the resist layer, the top oxide layer should be aggressively cleaned so that an organic residue of the resist material does not contaminate the top oxide of the ONO structure. Resist material remaining on the top oxide layer of the ONO structure can adversely affect the connection between the top oxide layer and an overlying polycrystalline silicon layer of the MONOS cell which degrades performance of the cell. According to known MONOS type cell structures, however, cleaning cannot be accomplished with an aggressive acid, such as hydrofluoric acid, since the aggressive acid can degrade the top oxide layer of the ONO structure.

Therefore, while recent advances in MONOS cell technology have enabled memory designers to improve MONOS cells, numerous challenges exist in the fabrication of material layers within these devices. In particular, a fabrication process of MONOS cells should accommodate precise control of the thickness of a bit-line oxide layer. In addition, the fabrication process should ensure a high quality ONO structure. Accordingly, advances in MONOS cell fabrication technology are necessary to control bit-line oxide layer fabrication and insure high quality MONOS cell devices.

BRIEF SUMMARY OF THE INVENTION

Such needs are met or exceeded by the present method for fabricating a MONOS cell. According to an aspect of the present invention a uniform bitline oxide layer is formed to ensure a desired thickness of the bit-line oxide layer and maintain a high quality ONO structure. In addition, a dual layer hard mask is used to form the buried bit-line to allow removal of a thick hard mask layer selectively form a thin hard mask layer without affecting the underlying ONO structure. Therefore, a quality of the MONOS cell is improved.

More specifically, in one form, a process for fabricating a buried bit-line structure for a MONOS cell includes providing a semiconductor substrate and forming an ONO structure to overlie the semiconductor substrate. Thereafter, a thin mask layer is formed to overlie the ONO structure to protect the ONO structure during a selective etch of a thick mask layer. The thick mask layer is formed to overlie the thin mask layer to protect the ONO structure during boron and arsenic implants. Thereafter, an etch process is performed in the ONO structure and a silicon oxide layer is formed to fill the etched area. A chemical-mechanical-polishing process is performed to planarize the silicon oxide layer and to form a planar surface continuous with an upper surface of the thick mask layer. The planarized silicon oxide layer functions as a bit-line oxide layer.

BRIEF DESCRIPTION OF THE DRAWINGS

Other features and advantages of the invention will be apparent to those skilled in the art with reference to the detailed description and the drawings, of which.

Figure 1:
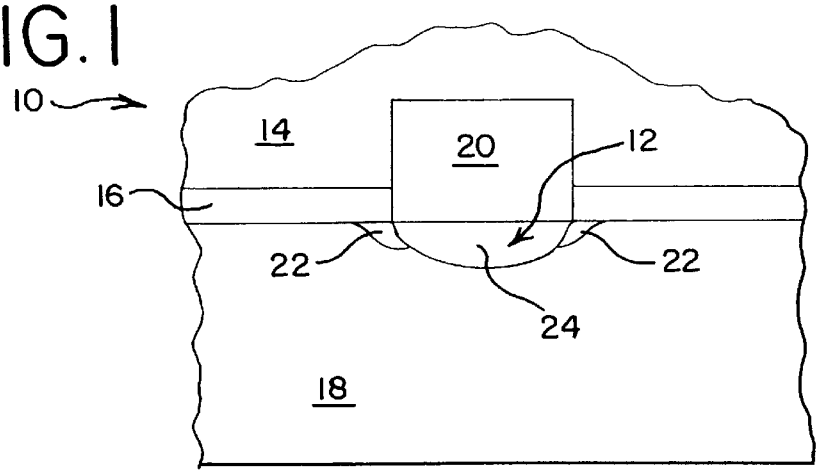
FIG. 1 illustrates, in cross-section, a portion of a semiconductor substrate containing a transistor that incorporates a bit-line oxide layer fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Referring to FIG. 1, a memory portion of a MONOS cell 10 is shown in cross-section. MONOS cell 10 can form the memory portion of a non-volatile memory device, such as an EEPROM device, a flash memory device, and the like. MONOS cell 10 includes at least one buried bit-line 12, a word-line 14, and an ONO structure 16, which function together to determine the location of a charge stored in memory. Bit-line 12 and ONO structure 16 overlie a semiconductor substrate 18. Overlying the bit-line 12 is a bit-line oxide layer 20, and also included are boron regions 22 and an arsenic region 24.

Those skilled in the art will recognize that the proper functioning of a MONOS device necessarily requires that an electrical charge is accurately introduced into a silicon nitride layer of ONO structure 16. In particular, a uniform bit-line oxidation process is necessary to accurately form bit-line oxide layer 20. In addition, a high quality ONO structure must be maintained during the fabrication process. Control of the bit-line oxide layer thickness and the high quality ONO structure, which are obtained by the present invention, can be better understood following a description of a MONOS fabrication process carried out in accordance with the invention.

Figure 2:
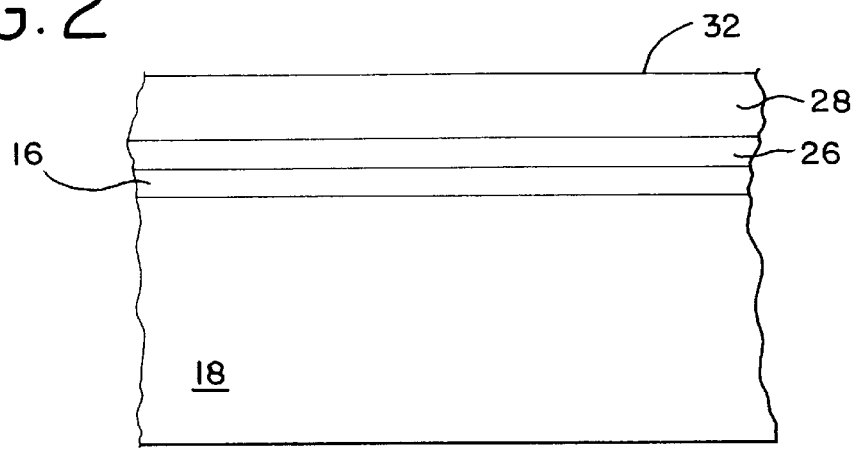
FIGS. 2–6 illustrate, in cross-section, process steps for the fabrication of a buried bit-line structure in accordance with the invention.

Referring now to FIG. 2, those skilled in the art will appreciate that an ONO structure 16 is formed to overlie semiconductor substrate 18. Thereafter, according to a preferred embodiment of the present invention, a thin mask layer 26 is formed to overlie ONO structure 16 to form a protective mask. Preferably, polycrystalline silicon is utilized to form thin mask layer 26. Those skilled in the art will appreciate that other materials may be used to form the thin mask, such as silicon nitride and the like, so long as the material can be stripped without damaging ONO structure 16.

According to a preferred embodiment of the present invention, thin mask layer 26 is about 200 angstroms thick. Those skilled in the art will appreciate that another thickness can be used so long as thin mask layer 26 is thin enough to be removed without damaging ONO structure 16 and thick enough to stop the selective etch of an overlying thick mask layer 28.

Thick mask layer 28 is formed to overlie thin mask layer 26 to act as an implant stop during bit-line arsenic and boron implantation. If thin mask layer 26 was formed from polycrystalline silicon, preferably, silicon nitride is used to form thick mask layer 28, and vice versa. Those skilled in the art will appreciate that a material for thin mask layer 26 and thick mask layer 28 should differ so that thick mask layer 28 can be selectively etched from thin mask layer 26. Thus, according to the invention, thick mask layer 28 can be aggressively etched since the existence of thin mask layer 26 allows for more margin of error for stripping thick mask layer 28 without damaging ONO structure 16.

Figure 3:
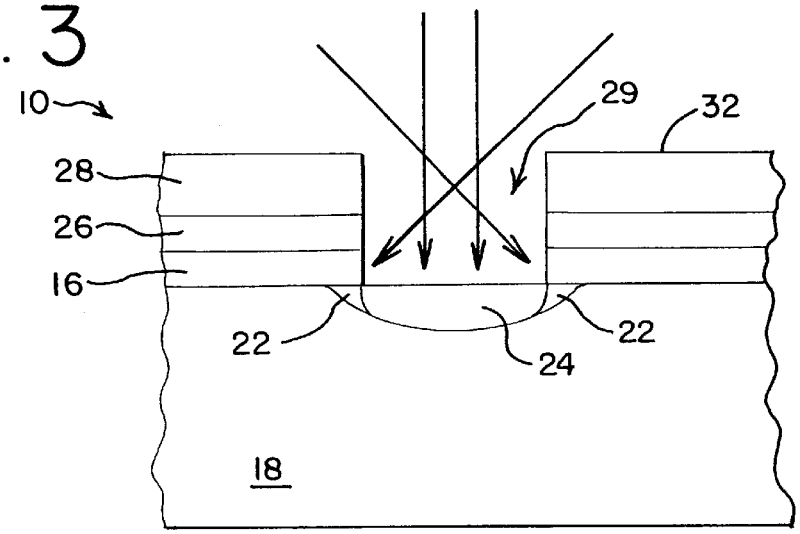

Referring to FIG. 3, a combined thickness of thin mask layer 26 and thick mask layer 28 is preferably about 2000 angstroms. Those skilled in the art will appreciate that another thickness can be used so long as the thickness acts as an effective implant stop. Then, a lithographic patterning and etching process is carried out to form opening 29.

After forming thin mask layer 26 and thick mask layer 28, ONO structure 16 is etched to semiconductor substrate 18. Thereafter, to further form buried bit-line region 12, boron and arsenic are implanted into semiconductor substrate 18, which forms boron regions 22 and arsenic region 24 respectively. Preferably, boron is implanted at a high angle, typically about twenty-five degrees to form boron regions 22. In addition, arsenic is implanted at a low angle, typically about zero to about seven degrees, to form arsenic region 24. Those skilled in the art will appreciate that other angles can be used so long as the semiconductor substrate 18 is sufficiently doped after the implant process.

Figure 4:
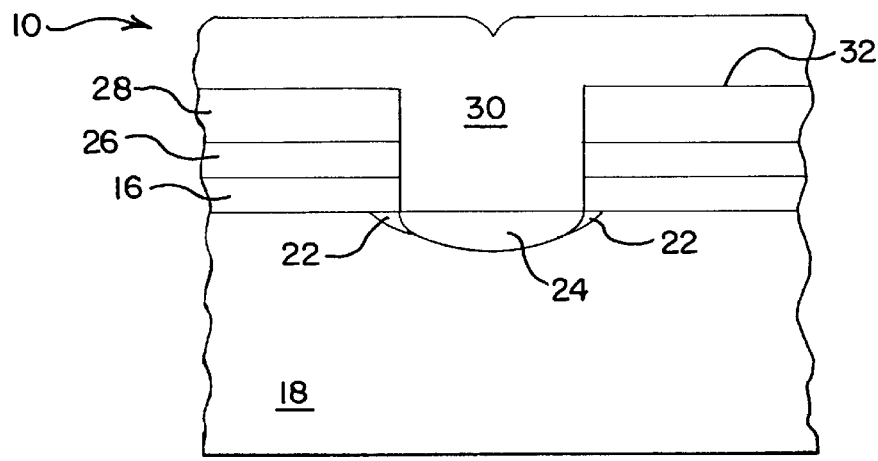

Referring to FIG. 4, after the boron and the arsenic are implanted, a silicon oxide layer 30 is formed to substantially fill opening 29 and to overlie an upper surface 32 of thick mask layer 28. For example, silicon oxide layer is deposited using a plasma-enhanced-chemical-vapor-deposition (PECVD) process carried out at a temperature of about 400° C. The process typically is carried out with a mixture of ozone and tetra-ethyl-ortho-silane (TEOS) gas, for a period of time sufficient to overfill the opening with silicon dioxide. Those skilled in the art will appreciate that silicon oxide layer 30 can be deposited by other processes, such as a low-pressure-chemical-vapor-deposition (LPCVD) process, a selective deposition process, a molecular beam deposition process, a high-density-plasma (HDP) deposition process, and the like.

After forming silicon oxide layer 30, a thermal anneal process can be performed to densify, and therefore to stabilize, silicon oxide layer 30. The thermal anneal process also acts to activate the implanted boron and arsenic. Preferably, the annealing process is performed at about 900° C.

Figure 5:
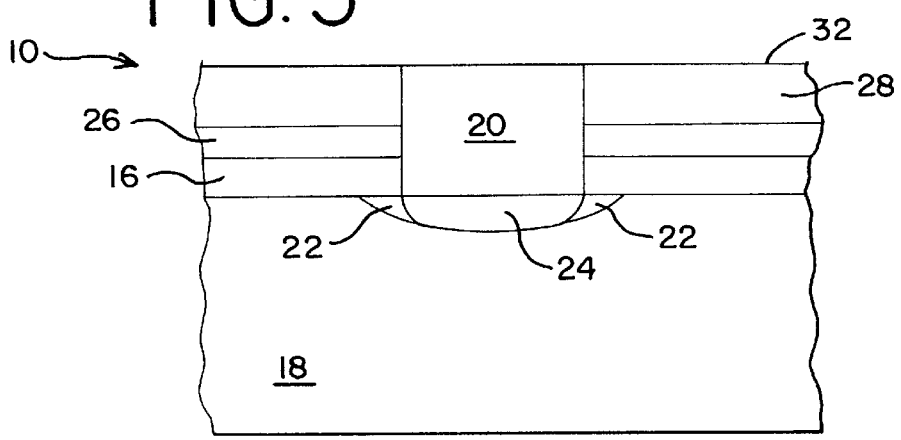

Referring to FIG. 5, after silicon oxide layer 30 is formed a planarization process is carried out to remove portions of silicon oxide layer 30 overlying upper surface 32 of thick mask layer 28 and to form the bit-line oxide layer 20. Preferably a chemical-mechanical-polishing (CMP) process is used to planarize silicon oxide layer 30 and to form a continuous surface with upper surface 30 of thick mask layer 28. Alternatively, a planarization etch process can be used to remove portions of silicon oxide layer 30. Thus, according to a preferred embodiment of the present invention, by forming the bit-line oxidation layer 20, and utilizing a planarization process, a bit-line layer 20 is formed having a thickness substantially similar to the depth to the combined depth of thin mask layer 26 and thick mask layer 28.

Figure 6:
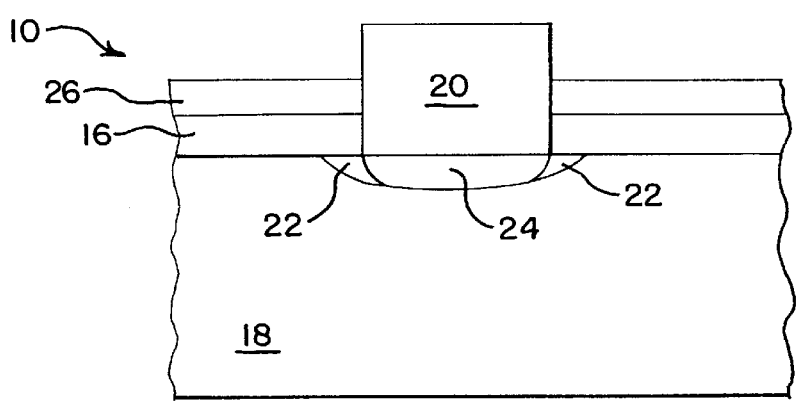

Referring to FIG. 6, after planarization, thick mask layer 28 can be aggressively removed without damaging ONO structure 16, which underlies thin mask layer 26. Thereafter, thin mask layer 26 is also removed from ONO structure 16.

Referring again to FIG. 1, the MONOS device is further processed by forming polycrystalline silicon layer to overlie the top oxide layer of ONO structure 16, and bit-line oxide layer 20. The polycrystalline silicon layer 14 is deposited, for example, by the LPCVD process. Thereafter, the MONOS cell processing continues in a manner known in the art.

From the foregoing description, it should be understood that an improved method of generating a MONOS cell has been shown and described which has many desirable attributes and advantages. According to the above described embodiments, a thickness of the bit-line oxide layer is ensured. In addition, by utilizing a dual hard mask during the fabrication process, a quality of the ONO structure is maintained. Therefore, a quality of the MONOS cell is improved.

Those skilled in the art will recognize that changes and modifications to the embodiments described above can be accomplished, and are contemplated by the present invention. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating a MONOS device, the process comprising the steps of:

providing a semiconductor substrate having a top surface, forming an ONO structure to overlie said semiconductor substrate;

forming a thin mask layer to overlie said ONO structure, said thin mask layer having a thin mask layer opening;

forming a thick mask layer to overlie said thin mask layer, said thick mask layer having an upper surface and a thick mask layer opening which overlies said thin mask layer opening;

performing an etch process in said ONO structure, wherein said etch process exposing a portion of the top surface of the semiconductor substrate, wherein said etched ONO structure corresponds to said thin mask layer opening and said thick mask layer opening;

filling said etched ONO structure, said thin mask layer opening and said thick mask layer opening with a silicon oxide layer; and performing a chemical-mechanical-polishing process to planarize said silicon oxide layer and to form a planar surface continuous with said upper surface of said thick mask layer, wherein said planarized silicon oxide layer functions as a bit-line oxide layer.

2. The process of claim 1 further comprising the steps of:

removing said thick mask layer from said thin mask layer;

removing said thin mask layer from said ONO structure; and depositing a polycrystalline silicon layer to overlie said ONO structure.

3. The process of claim 1, further comprising the step of implanting boron and arsenic into the semiconductor substrate after the step of performing said etch.

4. The process of claim 1, wherein the step of performing an etch comprises utilizing a plasma etch process.

5. The process of claim 1, wherein the step of filling comprises using a plasma-enhanced-chemical-vapor-deposition process.

6. The process of claim 1, wherein the step of filling comprises using a low-pressure-chemical-vapor-deposition process.

7. The process of claim 1, wherein the step of filling comprises utilizing a high-density-plasma process.

8. The process of claim 1, wherein a combined thickness of said thin mask layer and said thick mask layer is about 2000 angstroms.

9. A process for fabricating a MONOS device including a buried bit-line, the process comprising the steps of:

providing a semiconductor substrate having at least one bit-line oxide layer, wherein said semiconductor substrate having a top surface;

forming the buried bit-line by first forming an ONO structure to overlie said semiconductor substrate, second, forming a thin mask layer to overlie said ONO structure, said thin mask layer having a thin mask layer opening, third, forming a thick mask layer to overlie said thin mask layer, said thick mask layer having an upper surface and a thick mask layer opening which overlies said thin mask layer opening, fourth, performing an etch process in said ONO structure, wherein said etch process exposing a portion of the top surface of the semiconductor substrate, wherein said etched ONO structure corresponds to said thin mask layer opening and said thick mask layer opening, fifth, filling said etched ONO structure, said thin mask layer opening and said thick mask layer opening with a silicon oxide layer; and sixth, performing a chemical-mechanical-polishing process to planarize said silicon oxide layer and to form a planar surface continuous with said upper surface of said thick mask layer, wherein said planarized silicon oxide layer functions as a bit-line oxide layer;

removing said thick mask layer from said thin mask layer; and removing said thin mask layer from said ONO structure.

10. The process of claim 9 further comprising the steps of:

depositing a polycrystalline silicon layer to overlie said ONO structure.

11. The process of claim 9, further comprising the step of implanting boron and arsenic into the semiconductor substrate after the step of performing said etch.

12. The process of claim 9, wherein the step of performing an etch comprises utilizing a plasma etch process.

13. The process of claim 9, wherein the step of filling comprises using a plasma-enhanced-chemical-vapor-deposition process.

14. The process of claim 9, wherein the step of filling comprises using a low-pressure-chemical-vapor-deposition process.

15. The process of claim 9, wherein the step of filling comprises utilizing a high-density-plasma deposition process.

16. The process of claim 9, wherein a combined thickness of said thin mask layer and said thick mask layer is about 2000 angstroms.

17. A process for fabricating a MONOS device including a buried bit-line, the process comprising the steps of:

providing a semiconductor substrate having at least one bit-line oxide layer, wherein said semiconductor substrate having a top surface;

forming the buried bit-line by first forming an ONO structure to overlie said semiconductor substrate, second, forming a thin mask layer to overlie said ONO structure, said thin mask layer having a thin mask layer opening, third, forming a thick mask layer to overlie said thin mask layer, said thick mask layer having an upper surface and a thick mask layer opening which overlies said thin mask layer opening, fourth, performing an etch process in said ONO structure, wherein said etch process exposing a portion of the top surface of the semiconductor substrate, wherein said etched ONO structure corresponds to said thin mask layer opening and said thick mask layer opening, fifth, filling said etched ONO structure, said thin mask layer opening and said thick mask layer opening with a silicon oxide layer; and sixth, performing a chemical-mechanical-polishing process to planarize said silicon oxide layer and to form a planar surface continuous with said upper surface of said thick mask layer, wherein said planarized silicon oxide layer functions as a bit-line oxide layer;

removing said thick mask layer from said thin mask layer;

removing said thin mask layer from said ONO structure; and depositing a polycrystalline silicon layer to overlie said ONO structure.

* * * * *